United States Patent [19]

Sheu et al.

[11] Patent Number: 5,567,970

[45] Date of Patent: Oct. 22, 1996

[54] POST METAL MASK ROM WITH THIN GLASS DIELECTRIC LAYER FORMED OVER WORD LINES

[75] Inventors: Shing-Ren Sheu, Tau-Yuan; Chen-Chiu Hsue; Chen-Hui Chung, both of Hsin-Chu, all of Taiwan

[73] Assignee: United Microelectronics Corporation, Hsin-Chu, Taiwan

[21] Appl. No.: 430,192

[22] Filed: Apr. 27, 1995

Related U.S. Application Data

[62] Division of Ser. No. 140,401, Oct. 25, 1993, Pat. No. 5,429,975.

[51] Int. Cl.$^6$ .................................................. H01L 29/78
[52] U.S. Cl. ........................... 257/390; 257/644; 257/650
[58] Field of Search .................................... 257/390, 437, 257/915, 644, 650, 402

[56] References Cited

U.S. PATENT DOCUMENTS 4,998,157  3/1991  Yokoyama et al. ..................... 257/914
5,081,052  1/1992  Kobayashi et al. ..................... 437/29

*Primary Examiner*—Robert R. Limanek
*Assistant Examiner*—David Hardy
*Attorney, Agent, or Firm*—William H. Wright

[57] ABSTRACT

A ROM device includes cells with buried bit lines in a semiconductor substrate. A thin insulating layer covers the substrate has closely spaced, parallel, word lines formed thereon arranged orthogonally relative to the bit lines. The word lines are covered with reflowed glass insulating layers about 2500Å thick. The glass insulating layers comprise a sublayer of undoped glass and an overlayer of doped glass, the underlayer about 500Å–1500Å thick and the overlayer about 1000Å–1500Å thick. An etched, patterned metal layer is formed on the glass insulating layer. The overlayer has been substantially removed by etching where the metal layer has been etched. An ion implantation pattern has been implanted into the substrate adjacent to the conductive lines. The device has been passivated. The implanted impurity ions having been activated by annealing the device.

20 Claims, 8 Drawing Sheets

POST METAL MASK ROM WITH THIN GLASS DIELECTRIC LAYER FORMED OVER WORD LINES

This is a Division of application Ser. No. 08/140,401, filed Oct. 25, 1993, now U.S. Pat. No. 5,429,975.

BACKGROUND OF THE INVENTION

1. Field of the Invention

This invention relates to Read Only Memory (ROM) manufacturing techniques and more particularly to code implanting during ROM manufacturing.

2. Description of Related Art

ROM devices are standard components of modern computer systems. A ROM comprises an array of Metal Oxide Semiconductor Field Effect Transistor (MOSFET's) arranged in columns and rows, wherein predetermined MOSFET's are either permanently conductive or nonconductive as a function of the variety of transistor. The alternative on/off operation of these devices states of the MOSFETs is adapted to use for storage of data, which remains in the device when the external power supply is off.

A ROM device includes an array of parallel, closely spaced lines comprising regions formed of a heavily doped impurity in a semiconductor substrate having an opposite type of background impurity. On the surface of the substrate an insulating layer is formed. Another array of closely spaced conductive lines formed on the surface of the insulating layer is arranged at right angles to the spaced lines in the substrate. Insulating layers are formed on the upper array of conductive lines. A metallurgy layer connects the two arrays of lines to circuits to address the lines and to read the data stored in the RAM, as is well known in the art.

At the intersection of a conductive line in the upper array which is commonly referred to as a "word line" and a pair of adjacent lines in the substrate, known as the "bit lines", a MOSFET is formed. The spaced lines in the substrate comprise the source and drain for the MOSFET. The conductive word line serves as the gate electrode of the MOSFET. Certain predetermined MOSFETs can be made permanently conductive by forming a region of an impurity of the opposite type from that in the bit lines, between adjacent bit lines and beneath the corresponding conductive line. This permanently non-conductive region is known as a code implant, and it is placed in the substrate to provide specific binary data. Such a ROM is constructed of NAND circuits as contrasted with the NOR type circuits employed in connection with this invention.

The conventional manufacturing process is to form the code implant regions very early in the ROM fabrication process, since an annealing step is required to activate the implanted impurity and also to recrystallize any implanted areas of the substrate. The annealing process involves heating the substrate above an acceptable temperature, which would damage the completed device, since the aluminum metallization conventionally used is damaged above a temperature of about 400° C. to about 450° C. for more than a minimum time interval, and the maximum possible temperature is the melting point of aluminum which is about 660°C. See the description of the prior art in the parent application, Ser. No. 140,401, filed Oct. 25, 1993, now U.S. Pat. No. 5,429,975 as shown in FIGS. 1A–1F thereof.

Next in the prior art process, there is passivation and pad etching followed by formation of the alloy by annealing at 410° C. in a furnace.

The conventional mask ROM programming methods include: programming by field oxide, channel ion implant, etc. It is desirable for a mask ROM that small die size, coincides with short turn around time. However, it is difficult when a conventional process, such as one of the above mentioned methods, is used for the process to achieve a short turn around time. This invention uses existing facilities in an industrial laboratory to achieve the short turn around time goal in an industrial factory.

In Hong et al "Very Late Programming Process for Mask ROM" (UMC2-92-008) a process of ROM manufacture includes buried bit lines, covered by a thin gate oxide layer on which polysilicon word lines are formed which are covered with a thick film of BPSG between 3,000Å and 8,000Å thick. Metallization is applied formed of aluminum, a refractory metal, refractory metal silicide or heavily doped polysilicon. The refractory metal or the refractory metal silicide are stated to be preferred because they will withstand higher temperatures than aluminum and can be annealed at 850° C. for about 15 minutes or 900° C. for 5 minutes. A resist layer is applied and patterned to define a code implant pattern. The code implantation is performed preferably with boron $B^{11}$ ions at a power of about 180 keV with an implantation dosage of about 1 E 13 to 1 E 14 atoms/cm$^2$. After implantation of the ions they are activated. Preferably, a passivating layer of silicon dioxide or silicon nitride in the range of 5,000Å to 10,000Å thick is deposited by PECVD. When the metallization is aluminum with a thick barrier metal layer, the activation of the implanted ions and recrystallization "must be done by rapid thermal annealing (RTA). In the critical RTA process . . . the device must be heated to a temperature not greater than about 650° C., but above a temperature of 550° C. and maintained for a time in the range between 3 and 10 minutes. The atmosphere of the RTA process may be an inert gas such as nitrogen."

Applicants find that it is difficult to employ an implant energy of 180 keV to implant through a thickness of 3,000Å or particularly through a structure comprising a 9,000Å thick combination of BPSG and a polycide word line. Accordingly an object of this invention is to use a thinner layer of BPSG with a thickness less than about 3,000Å.

The double charge method has a very low throughput, which is not well adapted to mass production.

The late programming etch back method is not adapted to a practical application from the point of end point issues and it is more complicated than desired. Accordingly an object of this invention is to avoid the late programming etch back method.

An object of this invention is to employ a lower temperature annealing process to achieve a high throughput.

Another object of this invention is an improved narrow metal pattern processing technique.

A further object of this invention is to employ an improved thinner BPSG layer.

SUMMARY OF THE INVENTION

In accordance with this invention a thin BPSG layer is formed with a thickness from about 2,000Å to about 3,000Å, preferably about 1,000Å USG and about 2,000Å BPSG.

For ultra small dimensions, in accordance with this invention, post metal ROM lithography techniques are employed as an antireflection coating.

In accordance with this invention an antireflection coating is employed comprising comprising titanium nitride (TiN), aluminum (Al), titanium nitride (TiN) on top of an aluminum layer.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 2:
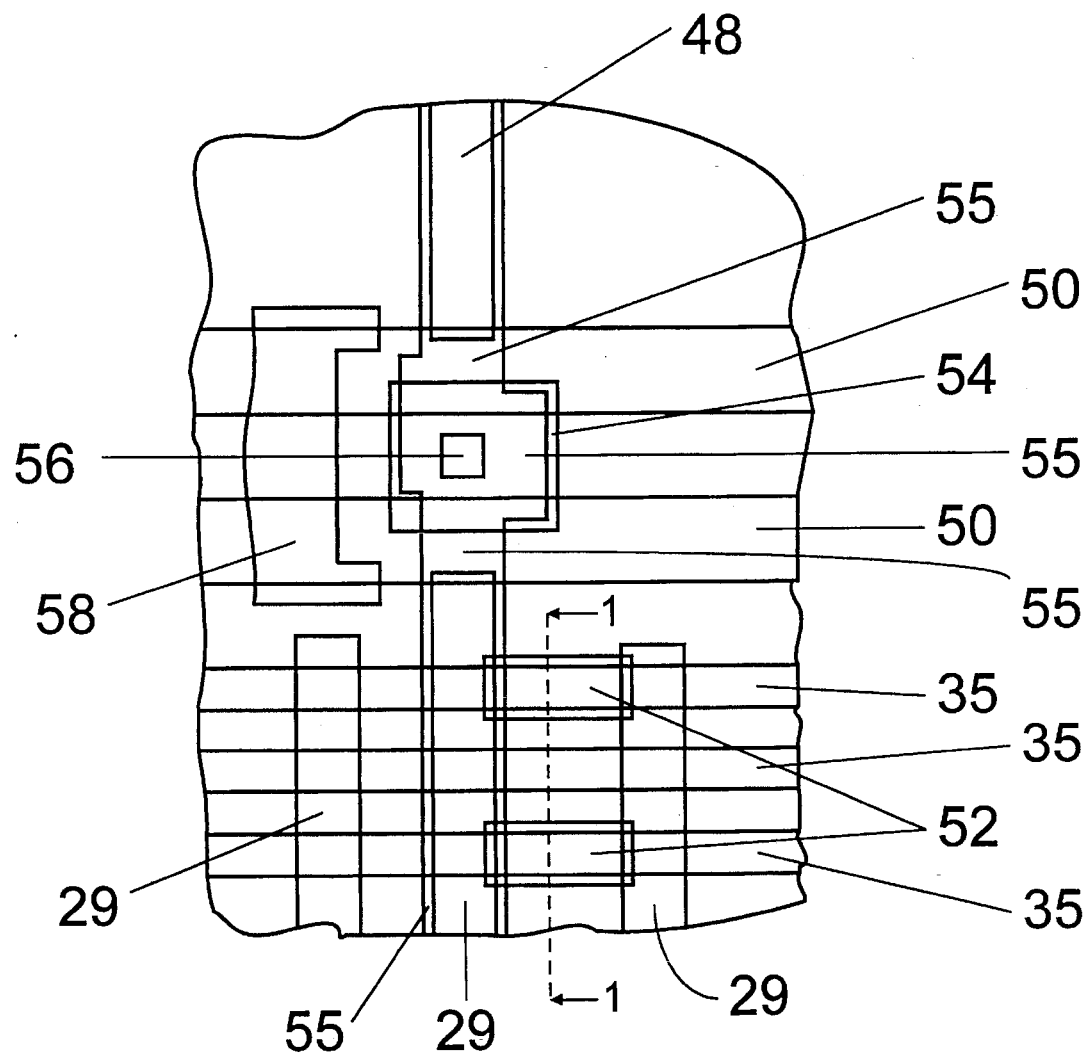
FIG. 2 shows a fragmentary plan view of a ROM formed in accordance width this invention.

Referring to FIG. 2, a fragmentary plan view of a ROM in accordance with this invention is shown. A pair of word lines 35 are shown extending from left to right across the page. A set of buried bit lines 29 in the semiconductor are shown extending at right angles to the word lines 35, within the semiconductor substrate 30. A metal structure 48 comprises TiN/Al/TiN (800Å/10,000Å/300Å) which serves the purpose of providing a main bit line 29 in cooperation with a word line 35 to access a specified bit of ROM data. Beneath the metal element 48 is a buried bit line 29. Between each buried bit line 29 is the ROM channel and placement of metal should be avoided in this region. Element 50 comprises a selector (polycide word line) which serves the purpose of selection of one of two adjacent cells.

Element 52 comprises a custom ROM code outside of the cell area which serves the purpose of a Mask ROM data storage element. Element 54 comprises a buried drain which serves the purpose of a main bit line pick up for bank cells. A 16, 32 or . . . word line set is employed. Element 56 comprises a contact which serves the purpose of interconnection between the main metal bit line and bank cells. Metal 55 bypasses the cell channel area.

Figure 1A:
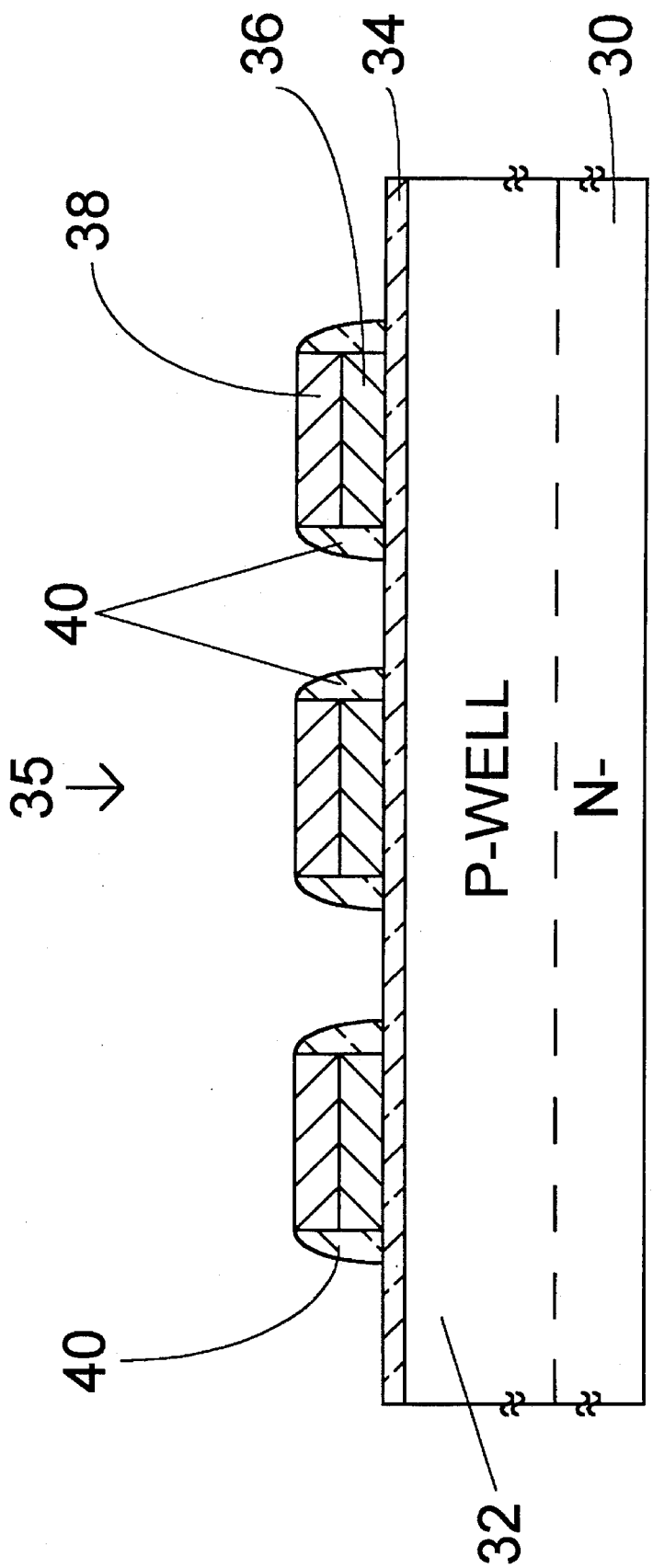
FIGS. 1A to 1G illustrate the process of forming a ROM device in accordance with this invention.

As shown in FIG. 1A an early step in the process of forming a ROM device in accordance with this invention commences with a N– doped semiconductor substrate 30 upon which a P-well 32 is formed by doping with an opposite (P-) type of dopant. Above the P-well 32 is formed a silicon dioxide gate oxide layer 34 about 200Å thick. Above the gate oxide layer 34, word lines 35 are formed from a sublayer of polysilicon 36 followed by an overlayer of a refractory metal silicide (known as polycide) 38, each about 1,500Å thick. Adjacent to the word lines 35 are formed silicon dioxide spacers 40. The refractory metal silicide is preferably tungsten silicide, polysilicon, titanium silicide, etc.

Figure 1B:
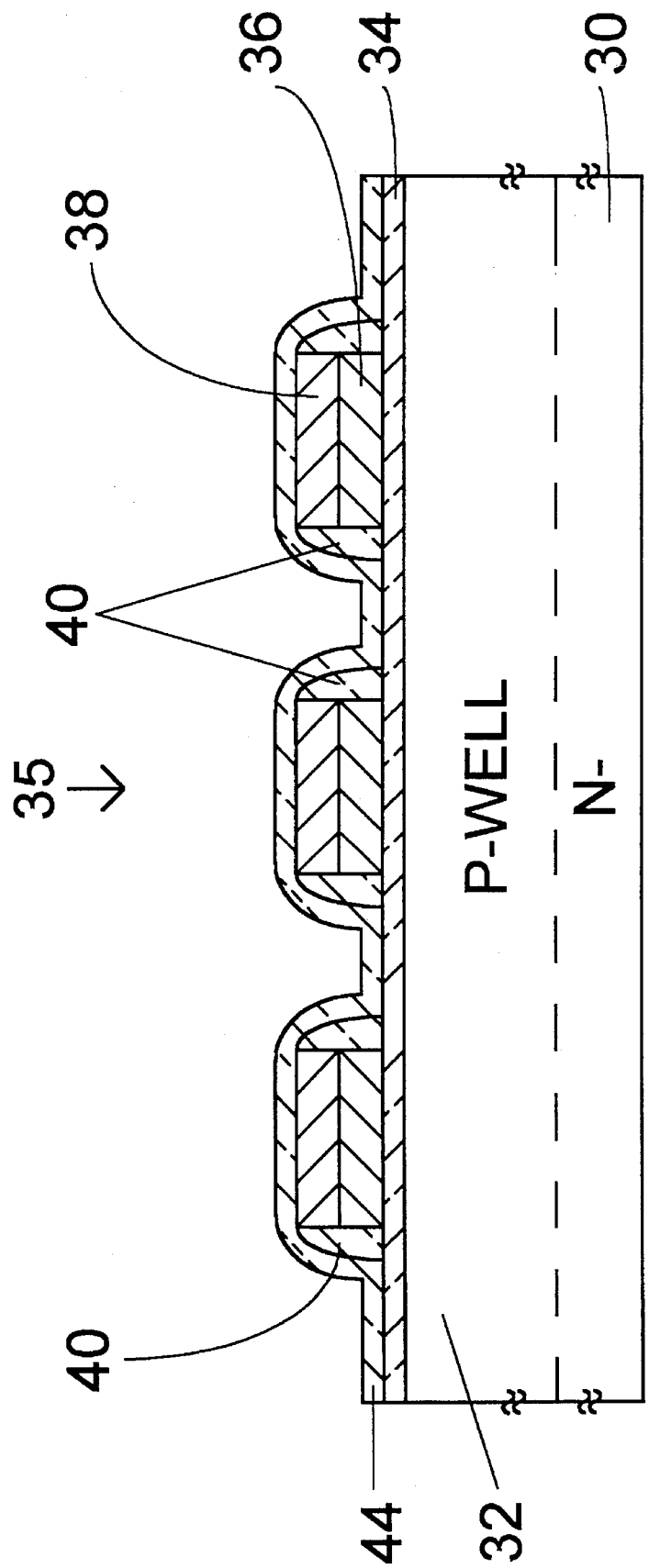

In FIG. 1B, the process of the present invention continues with formation of a thin layer 44 of USG (Undoped Silicon Glass, which is sometimes referred to as undoped BPSG) by APCVD (Atmospheric-Pressure Chemical Vapor Deposition or PECVD (Plasma Enhanced C.V.D.) to a thickness of about 1,000Å.

Figure 1C:
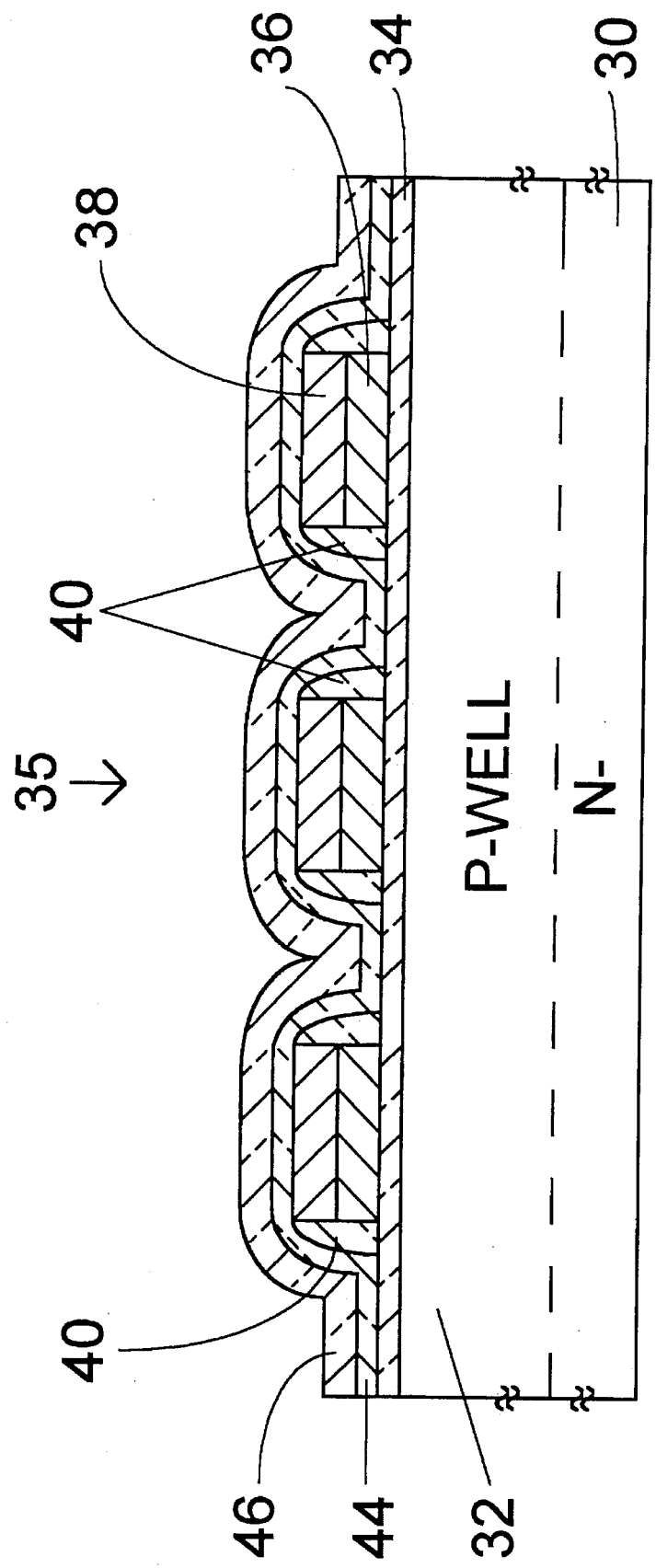

In FIG. 1C, the next step of the process of the present invention is to deposit a BPSG (or BPTEOS) layer 46 to a thickness of preferably about 2,000Å (within the range from about 1,000Å to about 2,000Å) with a preferred concentration of boron (B) of about 3.0 wt. % (preferably within the range from about 2.5 wt. % to about 5 wt. %) and with a preferred concentration of phosphorous (P) of about 5.2 wt. % (preferably within the range from about 3 wt. % to about 5.5 wt. %). The process used to deposit the BPSG layer 46 comprises an instrument selected from APCVD, PECVD, LPCVD (Low Pressure C.V.D.) which deposits BPSG, BPTEOS, TEOS, etc.

The typical BPTEOS composition of a boron-phosphorous $SiO_2$ is boron 4 wt. %, phosphorous 4 wt. %. The range is the same as above.

Figure 1D:
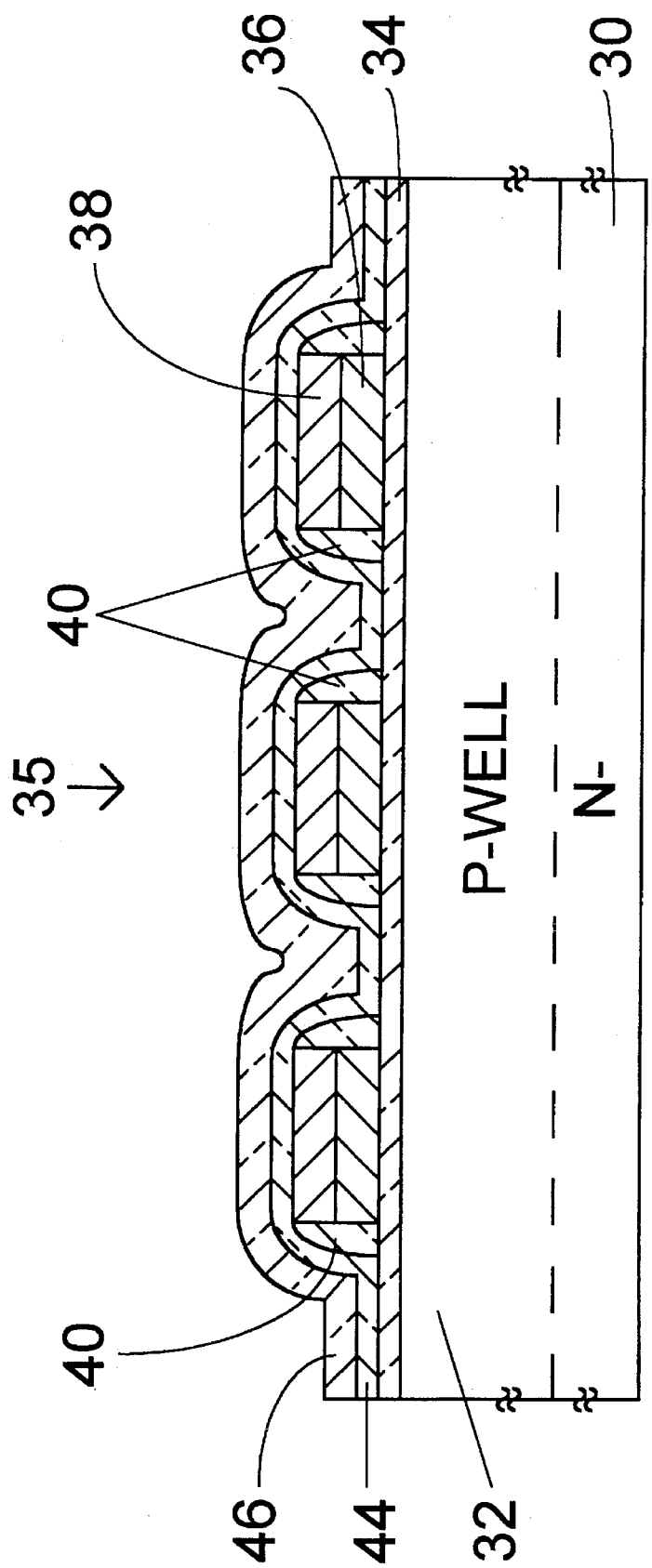

In FIG. 1D, the device of FIG. 1C has been heated to reflow the device of FIG. 1C covered with BPSG layer 46 at a temperature of about 900° C. which planarizes the combined USG layer 44 and BPSG layer 46. The undoped USG layer 44 remains about 1,000Å thick. The thickness of layer 46 is reduced to about 1,500Å thickness and the combined thickness of layers 44 and 46 is reduced to about 2,500Å in the locations above the word line region. The combined word lines 35 (layers 36 and 38) remain about 3,000Å thick for a total thickness of about 5,500Å. The ranges of thickness of USG after the fellow is about 1,000Å. The thickness of the BPSG after the reflow is within the range from about 1,000Å and about 2,000Å.

Next a step of formation of contact 56 is performed involving formation of a resist mask and etching to form contact 56 as shown in FIG. 2.

Figure 1E:
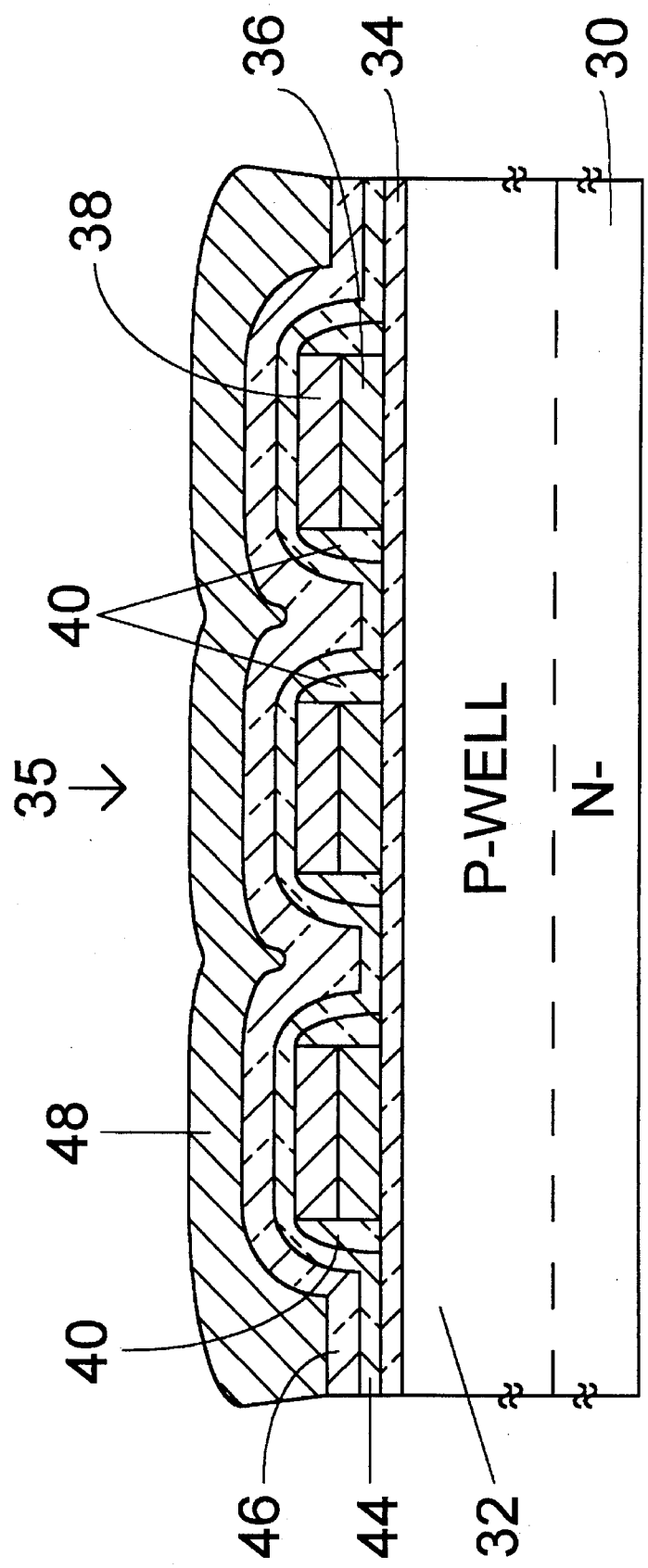

In FIG. 1E, after the device of FIG. 1D has been subjected to formation of contacts by photolithography and etching, it is coated with a metal layer 48, preferably by sputtering. In accordance with this invention, the metallization is a first layer of titanium (Ti) about 500Å thick. Then an RTA (Rapid Thermal Anneal) is performed to form $TiSi_2$. Next, aluminum (Al) is deposited preferably about 10,000Å thick (within the range from about 8,000Å to about 11,000Å) and a thin upper layer of TiN (titanium nitride) preferably about 800Å thick (within the range from about 100Å to about 400Å.)

Figure 1F:
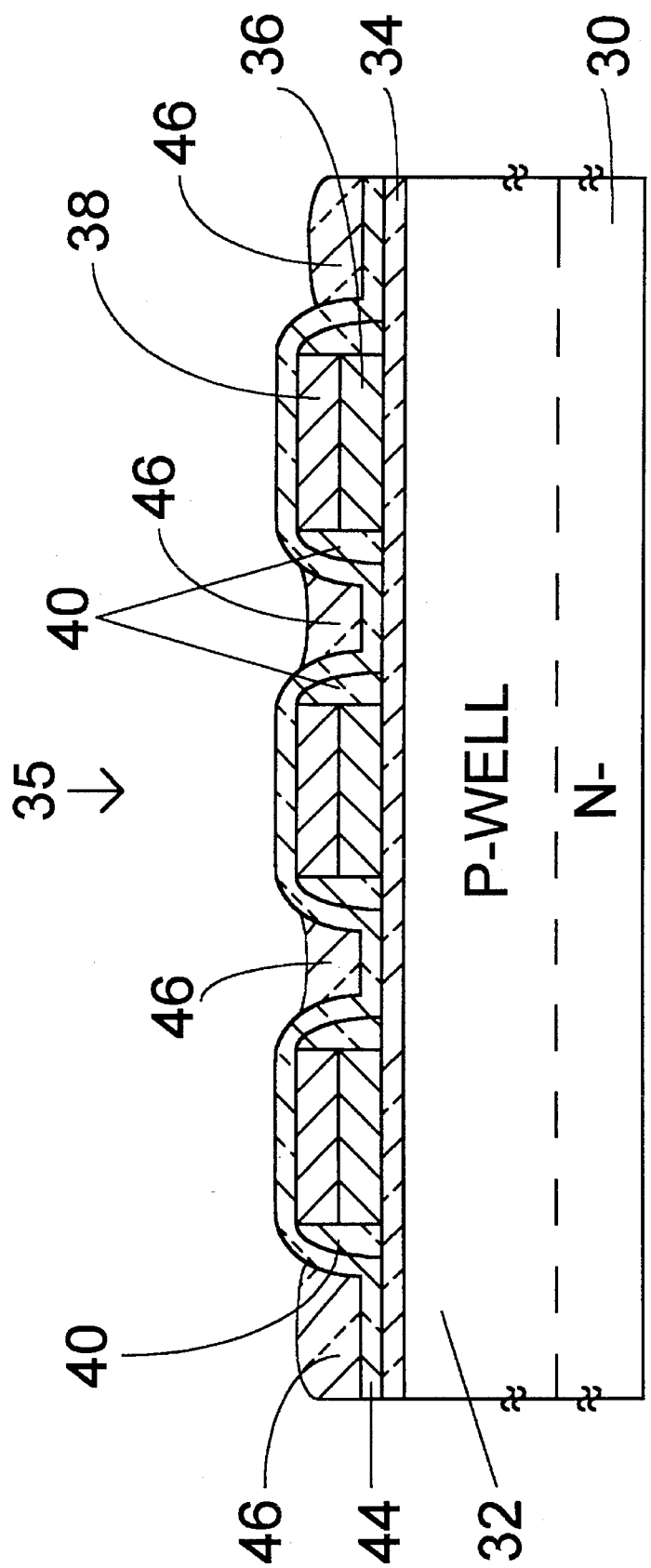

In FIG. 1F, after the metal 48 is deposited, photoresist is then applied, masked and developed in the form of the metal pattern desired. The metal 48 is etched by a metal etching process leaving metal in the area desired for the code implant. However, during the etching substantially all of the BPSG layer 46 is also removed, leaving behind the layer beneath comprising the 1,000Å thick USG layer 44 (with a range of thicknesses of USG layer 44 between about 500Å and 1,500Å.) Above the channel a layer of gate oxide 34 (200Å), polysilicon layer 36 (1,500Å), polycide 38 (1,500Å), and USG layer 44 (1,000Å.)

Figure 1G:
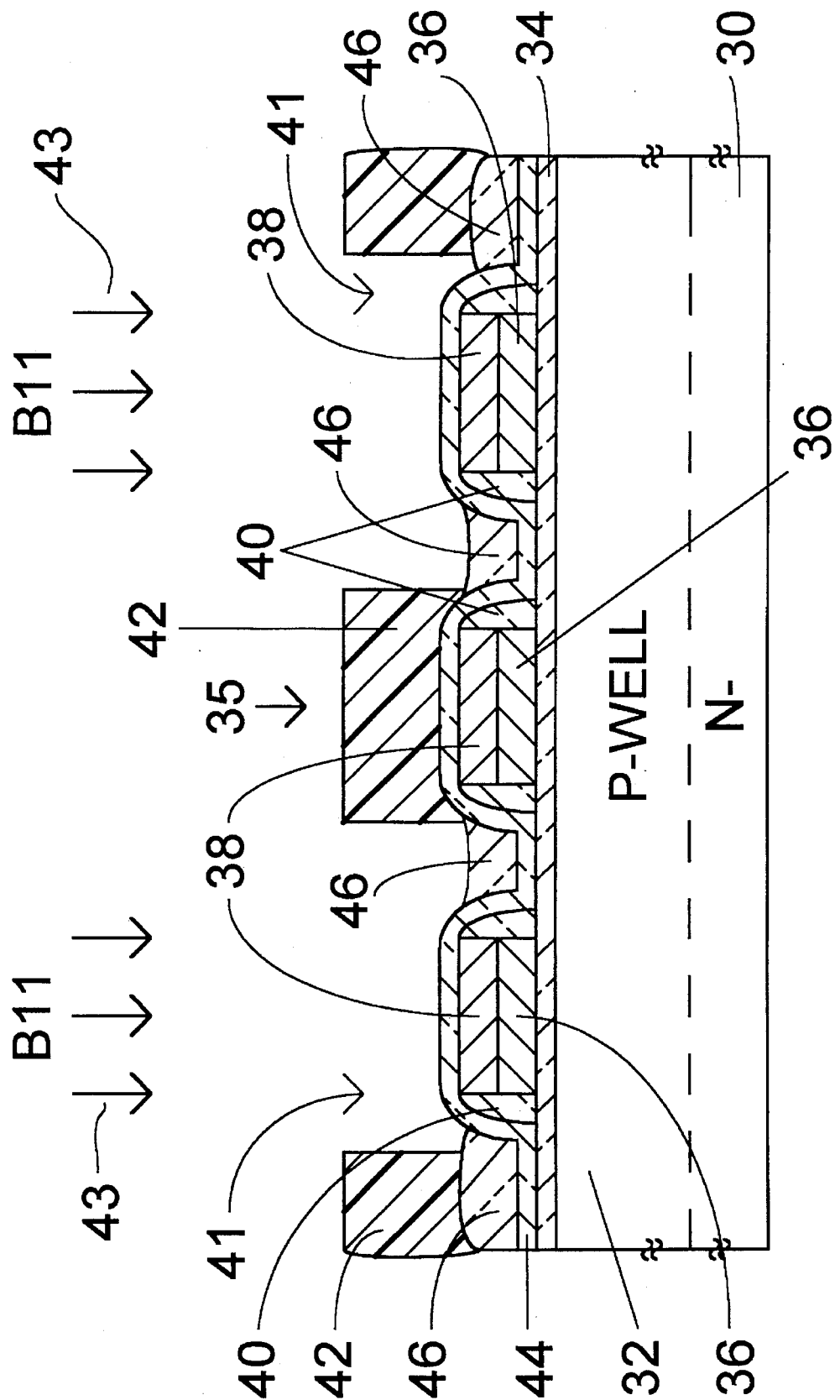

In FIG. 1G, the process continues with application of a layer of photoresist 42 which is patterned for application of ions 43 boron $B^{11}$ dopant to be implanted adjacent to the spacers 40 with an ion implanter operating at an energy level of about 180 keV (which can range from about 100 keV to about 200 keV with an implantation dosage concentration of about 1 E 14 atoms/$cm^2$ to about 4 E 15 atoms/$cm^2$.

Following the steps shown in FIG. 1G, the next steps are code etching, passivation and pad etching.

Subsequently, the final step of the process is formation of the alloy by annealing at about 450° C. in a furnace. The temperature can range from about 400° C. to about 520° C.

This invention is adapted to be implemented into an industrial standardized enhancement code mask ROM process. The very limited cost of employing this method is simply the cost of fabrication of a new metal mask. The metal pattern of the mask should bypass all the ROM cell channel area inside a ROM product, where ROM coding area may be implanted into it, as shown in FIG. 3. Thus, the threshold voltage of these ROM cells increases almost an order of magnitude from about 0.7 Volts to about 5.5 Volts. The two different states of a ROM transistor can be permanently programmed in either the "on" or the "off" state during its fabrication process, by using a custom designed code mask.

Details of the process steps of this method as shown in FIGS. 1A to 1G can be compared with a traditional method. The cycle time from the time of receiving a custom designed code to the time at which the wafer process is finished is reduced drastically by using the method of FIGS. 1A–1G.

Key features of the process of this invention include:

a) Excellent planarization of BPSG (Boron Phosphorous Silicate Glass) film is achieved by adjusting boron vs. phosphorous ratio. The BPSG film should be thin enough for a memory current implanter to implant boron ions through the polysilicon gate of ROM cell transistor, directly into the channel region. The cross section is flattened. The flatter the BPSG film, the greater the accuracy with which the threshold voltage can be controlled in the case of coding, because the boron project range is located almost a uniform distance beneath the channel region.

b) A narrow metal pattern is processed by using an anti-reflection coating technique. TiN≈300 Å The thin TiN film provides an anti-reflection advantage by reducing the reflection index very substantially as compared with an aluminum film.

c) Post-metal ROM code lithography technique: The photo-resist should be thick enough to avoid the type of thick metal patterns attributable to inadequate photo-resist coverage. In addition, resolution should be maintained as well. (A resist such as Fuji Hunt FH 6400L photoresist is particularly helpful in achieving our goals.

d) A low temperature annealing process is employed in a furnace with parameters of 450° C. for 30 minutes in an atmosphere of a predetermined gas, e.g. $N_2$ or forming gas. Forming gas containing H2 and N2 (a traditional gas for alloying) is used to prevent metal oxidation. Activation of boron which has been implanted is approximately 45%, as compared with 100% activation of $B^{11}$ at a temperature of 900° C. The $B^{11}$ dopant has been increased from the traditional process value of 9 E 13 /cm$^2$ to a value of 2 E 14 /cm$^2$.

e) A zero degree medium current ion implanter performs a low damage ion implant process.

Circuit characterization of a 4 Megabit and an 8 Megabit mask ROM has been verified by using the present invention. The resultant product made by this invention is successful both in terms of circuit characterization and device reliability.

Advantages of the present invention include as follows:

1. After the metal is etched it is then programmed by a medium current implanter to reach a "short turn around time" and to avoid the damage issue which would arise with the use of a high voltage implanter.

2. The invention can be implemented in a flat cell ROM structure permitting a small die size.

3. The wafer acceptability test can be held before the programming process and accordingly a greater yield prediction of ½ cell (on cell) can be achieved reducing waste.

4. 0.8 μm NMOS hot carrier stress. Device reliability is not affected by this invention. The circuit's ESD (Electro-Static Discharge) technology and latch-up even performance are qualified by using the mil-standard at the industrial level.

5. There is no loss of yield from using this process.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A Read Only Memory device with an array of cells with a thin doped glass overlayer and with improved metallurgy comprising:

a plurality of closely spaced line regions with a first impurity type in and adjacent to the surface of a semiconductor substrate having a background impurity of a second opposite type, a thin insulating layer on the surface of said substrate, a plurality of closely spaced, parallel, electrically conductive lines on the thin insulating layer arranged orthogonally relative to said line regions, reflowed glass insulating layers over said conductive lines having a thickness of about 2500Å, said glass insulating layers comprising a sublayer of undoped glass and an overlayer of doped glass, said underlayer having a thickness of between about 500Å and about 1500Å and said overlayer having a thickness of about 1000Å and about 1500Å, a contact to said device, an etched, patterned metal layer on said glass insulating layer, said overlayer having been substantially removed by etching where said metal layer has been etched, an ion implantation pattern in which impurity ions have been implanted into said substrate adjacent to said conductive lines, said device having been passivated, and said implanted impurity ions having been activated by annealing said device, whereby the metallurgy and the electrical contacts to the substrate, line regions and conductor lines are protected from adverse effect during annealing.

2. A device in accordance with claim 1 wherein said overlayer of doped glass comprises glass doped with boron and phosphorous.

3. A device in accordance with claim 1 wherein said overlayer of doped glass comprises glass doped with boron within the range from about 2.5 weight percent to about 5 weight percent and a concentration of phosphorous within the range from about 3 weight percent to about 5.5 weight percent.

4. A device in accordance with claim 3 wherein said overlayer of doped glass comprises glass doped with about 3.0 weight percent boron and 5.2 weight percent phosphorous.

5. A device in accordance with claim 4 wherein said metallization comprises a thin upper layer of titanium having a thickness of about 500Å, a layer of aluminum having a thickness within the range from about 8,000Å to about 11,000Å, and an upper layer of titanium nitride having a thickness within the range from about 100Å to about 400Å.

6. A device in accordance with claim 5 wherein said layer of aluminum is about 10,000Å thick and said layer of titanium nitride is about 300Å thick.

7. A device in accordance with claim 1 wherein said overlayer of doped glass comprises glass doped with about 3.0 weight percent boron and 5.2 weight percent phosphorous.

8. A device in accordance with claim 7 wherein said metallization comprises a layer of titanium having a thickness of about 500Å, a layer of aluminum having a thickness within the range from about 8,000Å to about 11,000Å, and an upper layer of titanium nitride having a thickness within the range from about 100Å to about 400Å.

9. A device in accordance with claim 8 wherein said layer of aluminum is about 10,000Å thick and said layer of titanium nitride is about 300Å thick.

10. A Read Only Memory device with an array of cells comprising:

a plurality of spaced line regions with a first P or N impurity type in and adjacent to the surface of a semiconductor substrate having a background impurity type, an insulating layer on the surface of said substrate, a plurality of spaced, parallel, electrically conductive word lines on said insulating layer arranged orthogonally relative to said line regions, a pair of reflowed, planarized pair of glass insulating layers comprising an undoped glass sublayer over said conductive lines, and a doped glass overlayer over said undoped glass sublayer, said planarized overlayer and said sublayer having a combined thickness of about 2500Å over said word lines, said underlayer having a thickness of about 1000Å and said overlayer having a thickness of about 1500Å, a contact to said device, a patterned metal layer on said glass insulating layer patterned by etching said metal layer and said glass overlayer through said resist layer to form patterned metal leaving behind said glass underlayer with a range of thicknesses of said glass underlayer with a thickness between about 500Å and about 1,500Å, impurity ions implanted into said substrate adjacent to said conductive lines in an ion implantation pattern, said device having been passivated, and said implanted impurity ions having been activated by annealing said device, whereby the metallurgy and the electrical contacts to the substrate, line regions and conductor lines are protected from adverse effect during annealing.

11. A device in accordance with claim 10 wherein said doped glass overlayer comprises glass doped with boron and phosphorous.

12. A device in accordance with claim 10 wherein said doped glass overlayer comprises glass doped with boron within the range from about 2.5 weight percent to about 5 weight percent and a concentration of phosphorous within the range from about 3 weight percent to about 5.5 weight percent.

13. A device in accordance with claim 10 wherein said doped glass overlayer comprises glass doped with about 3.0 weight percent boron and 5.2 weight percent phosphorous.

14. A device in accordance with claim 10 wherein said metallization comprises a layer of titanium having a thickness of about 500Å, a layer of aluminum having a thickness within the range from about 8,000Å to about 11,000Å, and an upper layer of titanium nitride having a thickness within the range from about 100Å to about 400Å.

15. A device in accordance with claim 14 wherein said layer of aluminum is about 10,000Å thick and said layer of titanium nitride is about 300Å thick.

16. A device in accordance with claim 14 wherein said overlayer of doped glass comprises glass doped with about 3.0 weight percent boron and 5.2 weight percent phosphorous.

17. A device in accordance with claim 16 wherein said metallization comprises a thin upper layer of titanium having a thickness of about 500Å, a layer of aluminum having a thickness within the range from about 8,000Å to about 11,000Å, and an upper layer of titanium nitride having a thickness within the range from about 100Å to about 400Å.

18. A device in accordance with claim 17 wherein said layer of aluminum is about 10,000Å thick and said layer of titanium nitride is about 300Å thick.

19. A Read Only Memory device with an array of cells comprising:

a plurality of spaced line regions with a first P or N impurity type in and adjacent to the surface of a semiconductor substrate having a background impurity type, an insulating layer on the surface of said substrate, a plurality of spaced, parallel, electrically conductive word lines on said insulating layer arranged orthogonally relative to said line regions, a pair of reflowed, planarized glass insulating layers comprising an undoped glass sublayer formed over said conductive lines, and a doped glass overlayer formed over said undoped glass sublayer, said planarized overlayer and said sublayer having a combined thickness of about 2500Å over said word lines, said underlayer having a thickness of between about 500Å and about 1500Å, a contact to said device, a patterned metal layer on said glass insulating layer patterned by etching said metal layer and said glass overlayer, said glass overlayer having been substantially removed by etching where said metal layer has been etched, said metallization comprising a thin lower layer of titanium having a thickness of 500Å, a layer of aluminum having a thickness between about 8,000Å and about 11,000Å, and a thin upper layer of titanium nitride having a thickness within the range from about 100Å to about 400Å, impurity ions implanted into said substrate adjacent to said conductive lines in an ion implantation pattern, said device having been passivated, and said implanted impurity ions having been activated by annealing said device, whereby the metallurgy and the electrical contacts to the substrate, line regions and conductor lines are protected from adverse effect during annealing.

20. A device in accordance with claim 19 wherein said layer of aluminum is about 10,000Å thick and said layer of titanium nitride is about 300Å thick, and said overlayer of doped glass comprises glass doped with about 3.0 weight percent boron and 5.2 weight percent phosphorous.

\* \* \* \* \*